United States Patent
Abe et al.

(10) Patent No.: US 10,937,628 B2
(45) Date of Patent: Mar. 2, 2021

(54) CHARGED PARTICLE BEAM DEVICE

(71) Applicant: Hitachi High-Tech Corporation, Tokyo (JP)

(72) Inventors: Chikako Abe, Tokyo (JP); Hitoshi Sugahara, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/477,573

(22) PCT Filed: Jan. 27, 2017

(86) PCT No.: PCT/JP2017/002967
§ 371 (c)(1),
(2) Date: Jul. 12, 2019

(87) PCT Pub. No.: WO2018/138874
PCT Pub. Date: Aug. 2, 2018

(65) Prior Publication Data
US 2019/0362938 A1    Nov. 28, 2019

(51) Int. Cl.
*H01J 37/20*    (2006.01)
*H01J 37/317*   (2006.01)
*H01J 37/147*   (2006.01)

(52) U.S. Cl.
CPC ...... *H01J 37/3174* (2013.01); *H01J 37/1472* (2013.01); *H01J 37/20* (2013.01);
(Continued)

(58) Field of Classification Search
CPC .... H01J 37/3174; H01J 37/20; H01J 37/1472; H01J 2237/31798; H01J 2237/31761;
(Continued)

(56) References Cited

U.S. PATENT DOCUMENTS

| 8,872,106 B2 | 10/2014 | Nishihama et al. |
| 2007/0120056 A1* | 5/2007 | Nagatomo ............ H01J 37/265 250/310 |

(Continued)

FOREIGN PATENT DOCUMENTS

| JP | 2010-67516 A | 3/2010 |
| JP | 2015-203614 A | 11/2015 |
| JP | 6043528 B2 | 12/2016 |

OTHER PUBLICATIONS

International Search Report (PCT/ISA/210) issued in PCT Application No. PCT/JP2017/002967 dated May 23, 2017 with English translation (three pages).

(Continued)

*Primary Examiner* — Michael Maskell
(74) *Attorney, Agent, or Firm* — Crowell & Moring LLP

(57) ABSTRACT

The purpose of the present invention is to provide a charged particle beam device with which it is possible to identify, to a high degree of accuracy, repeat patterns generated by a multiple exposure method such as SADP or SAQP. In order to achieve this purpose, there is proposed a charged particle beam device for: irradiating a first position on a sample with a charged particle beam to form an irradiation mark on the sample; after the formation of the irradiation mark, scanning the charged particle beam on a first visual field which includes the first position and which is larger than the irradiation mark, and thereby acquiring a first image; scanning the charged particle beam on a second visual field which includes the first position, which is larger than the irradiation mark, and which is in a different position from the first visual field, thereby acquiring a second image; and synthesizing the first image and the second image so as to overlap the irradiation marks included in the first image and the second image.

6 Claims, 10 Drawing Sheets

(52) U.S. Cl.
CPC ........... *H01J 2237/20228* (2013.01); *H01J 2237/31761* (2013.01); *H01J 2237/31798* (2013.01)

(58) Field of Classification Search
CPC ........... H01J 2237/20228; H01J 37/22; H01J 2237/2817; H01J 37/28; H01J 2237/2816
USPC ............ 250/396 R, 306, 307, 310, 311
See application file for complete search history.

(56) References Cited

U.S. PATENT DOCUMENTS

2011/0181688 A1* 7/2011 Miyamoto ............ G01B 15/04
348/36
2017/0040230 A1 2/2017 Yamaguchi et al.

OTHER PUBLICATIONS

Japanese-language Written Opinion (PCT/ISA/237) issued in PCT Application No. PCT/JP2017/002967 dated May 23, 2017 (three pages).

* cited by examiner

[FIG. 1]
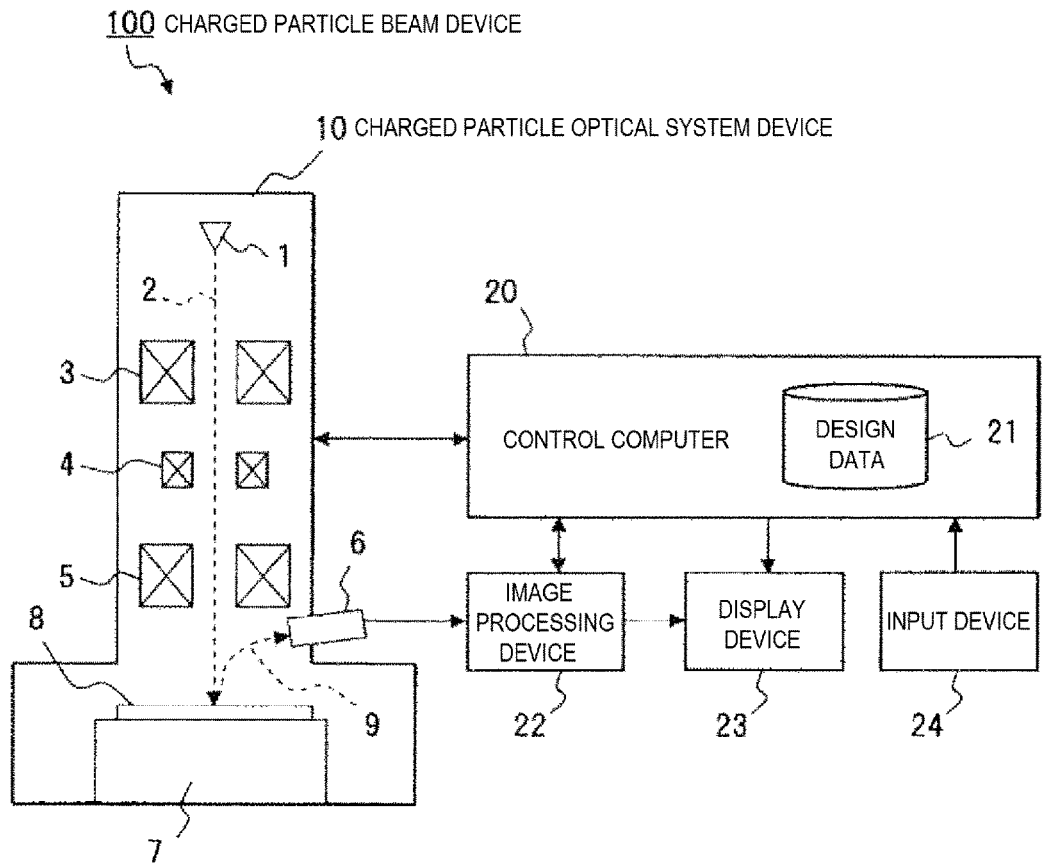
[FIG. 2]
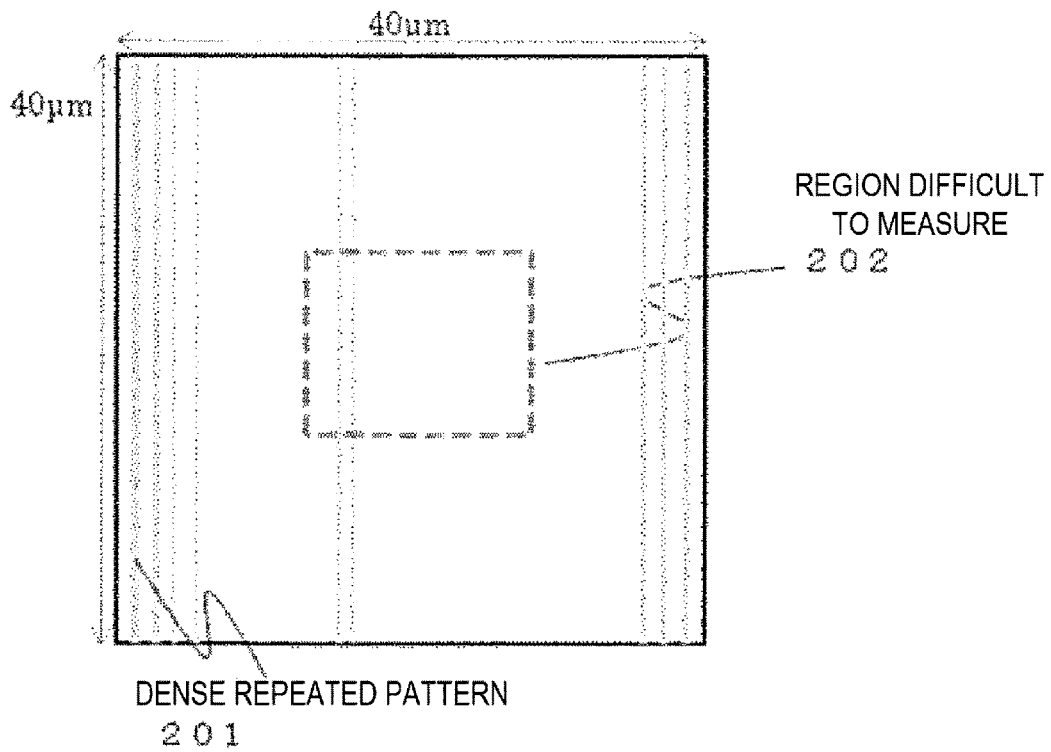

[FIG. 3]
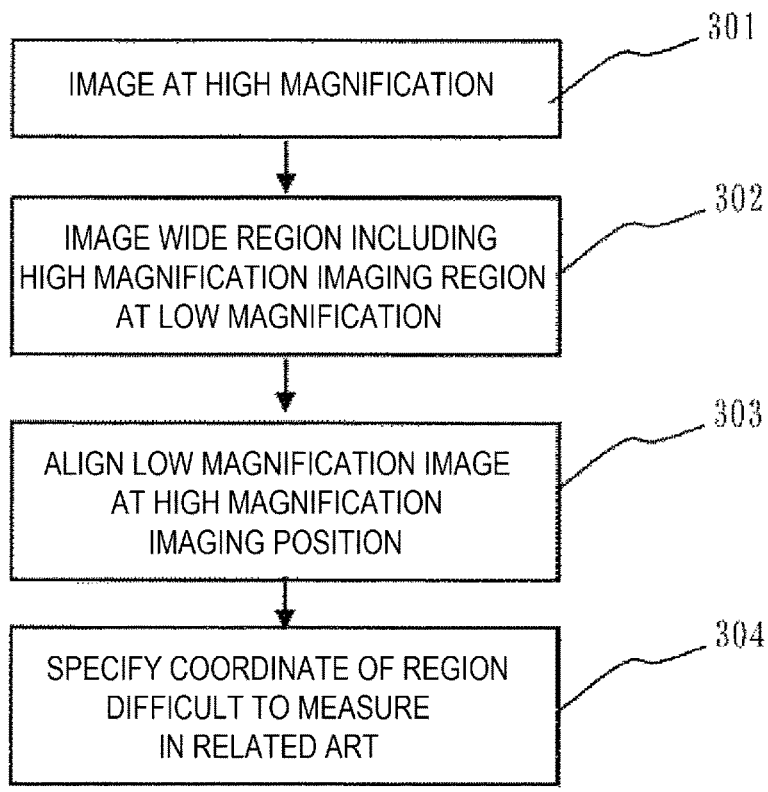
[FIG. 4]
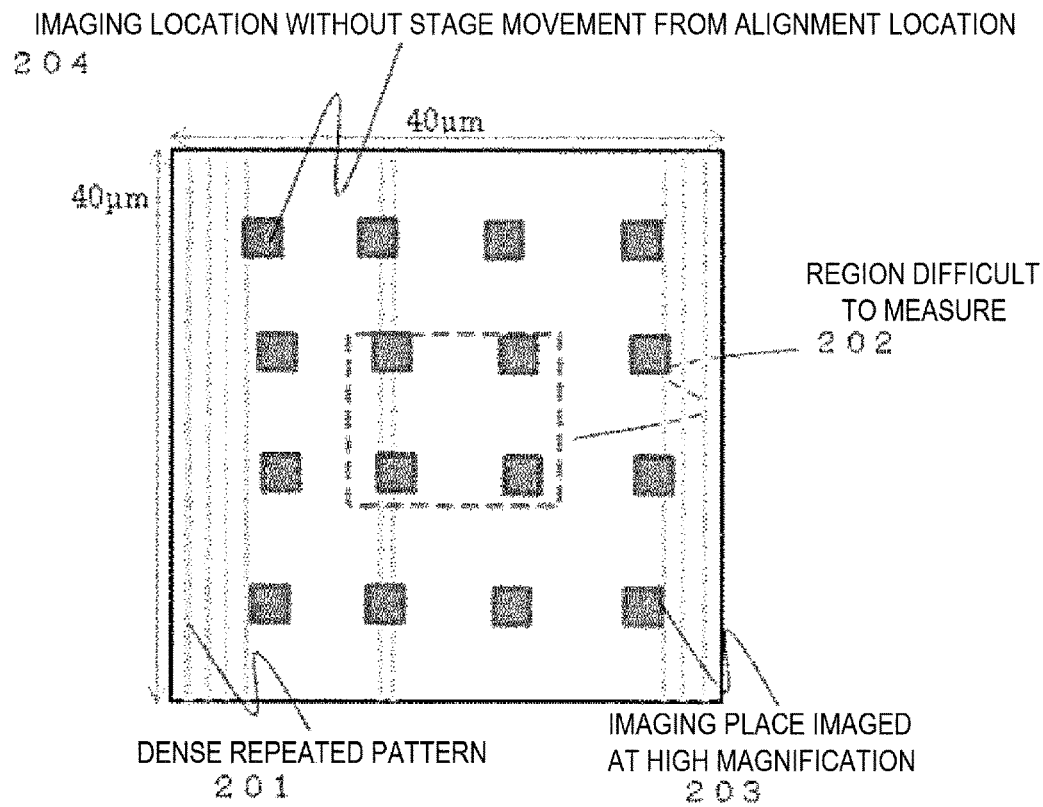

[FIG. 5]
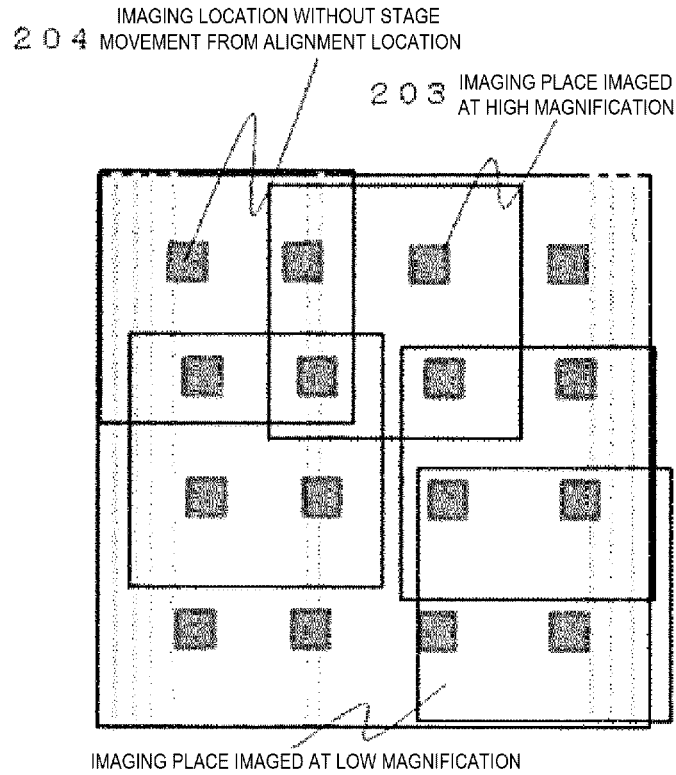
[FIG. 6]
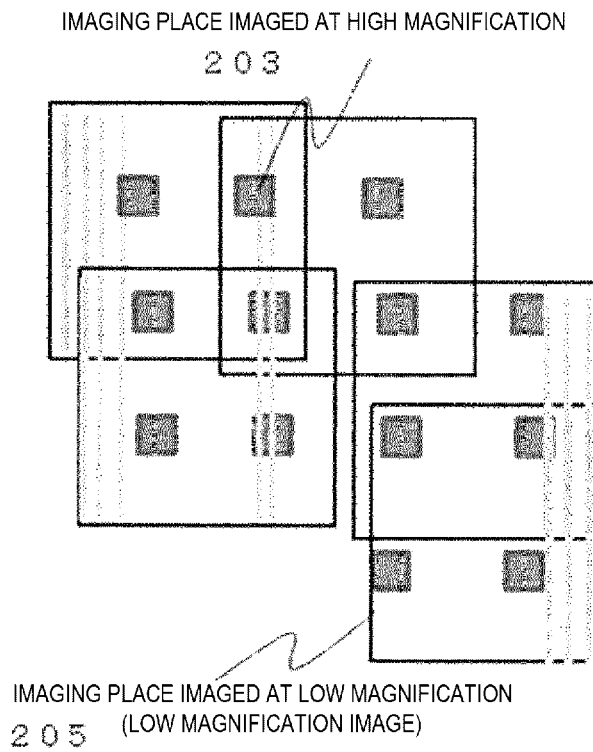

[FIG. 7]
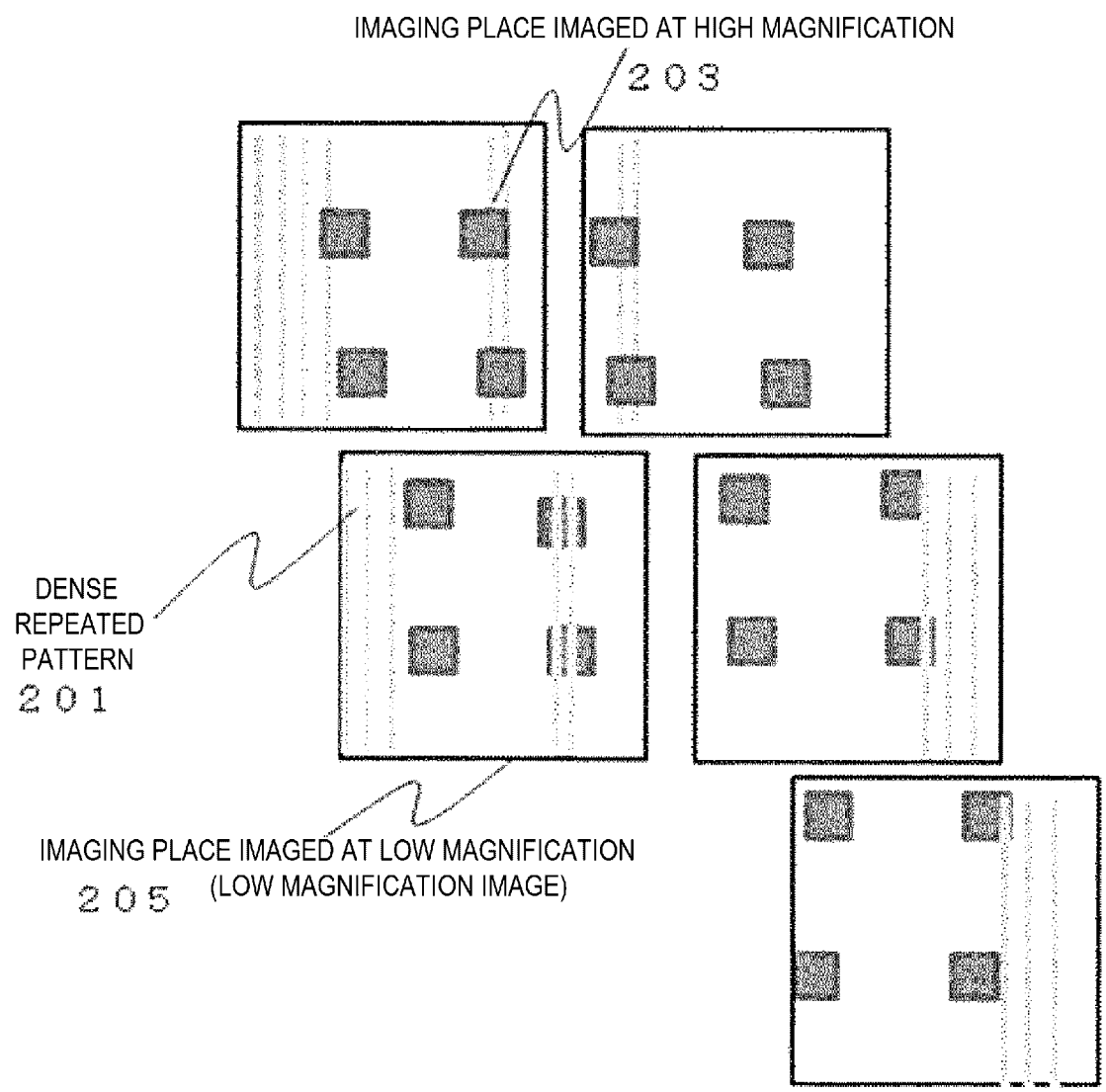

[FIG. 8]
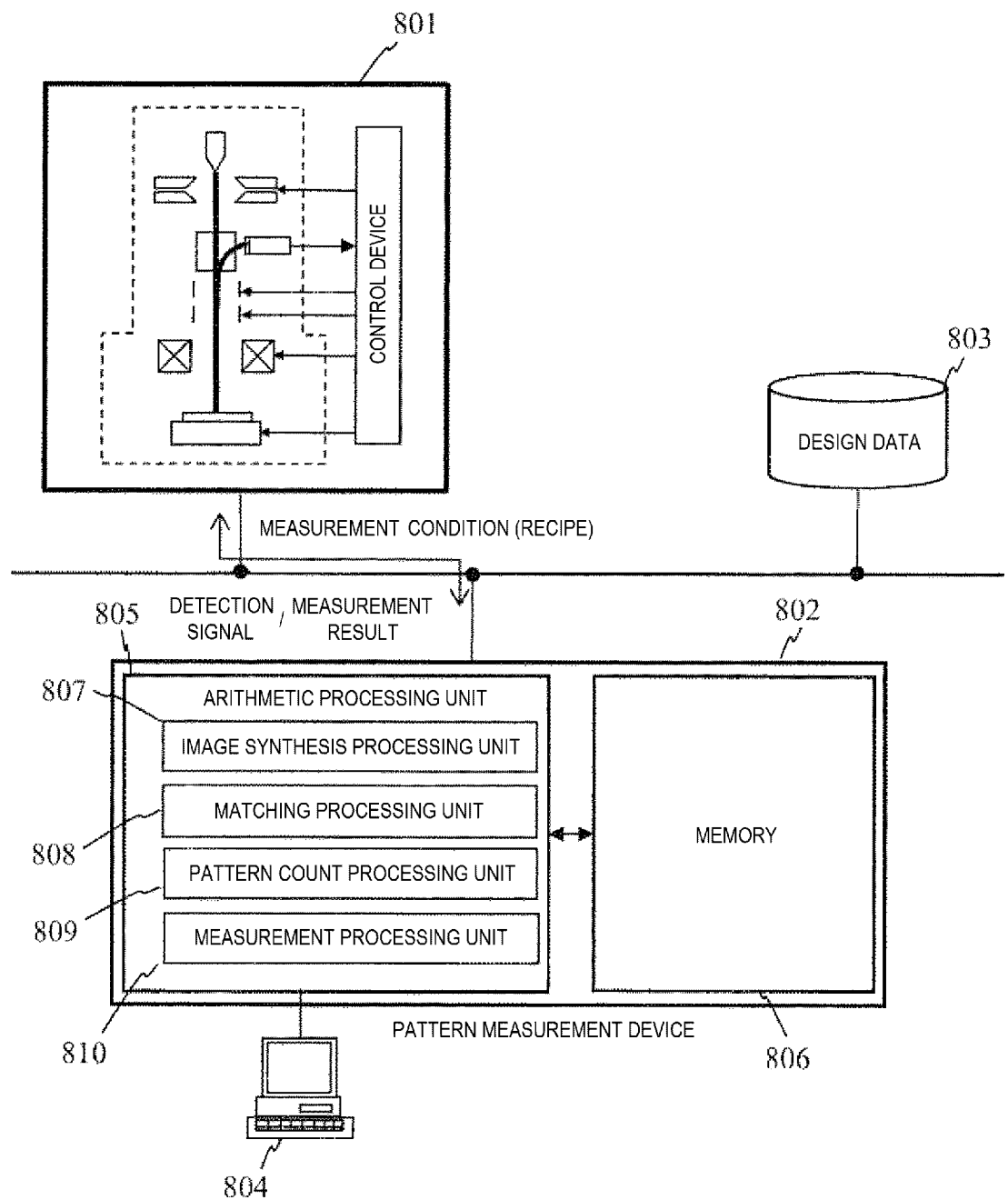

[FIG. 9]
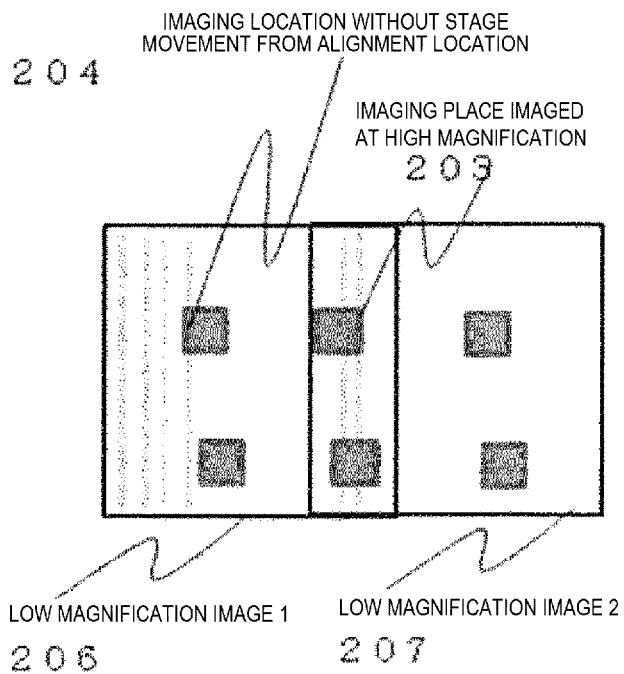
[FIG. 10]
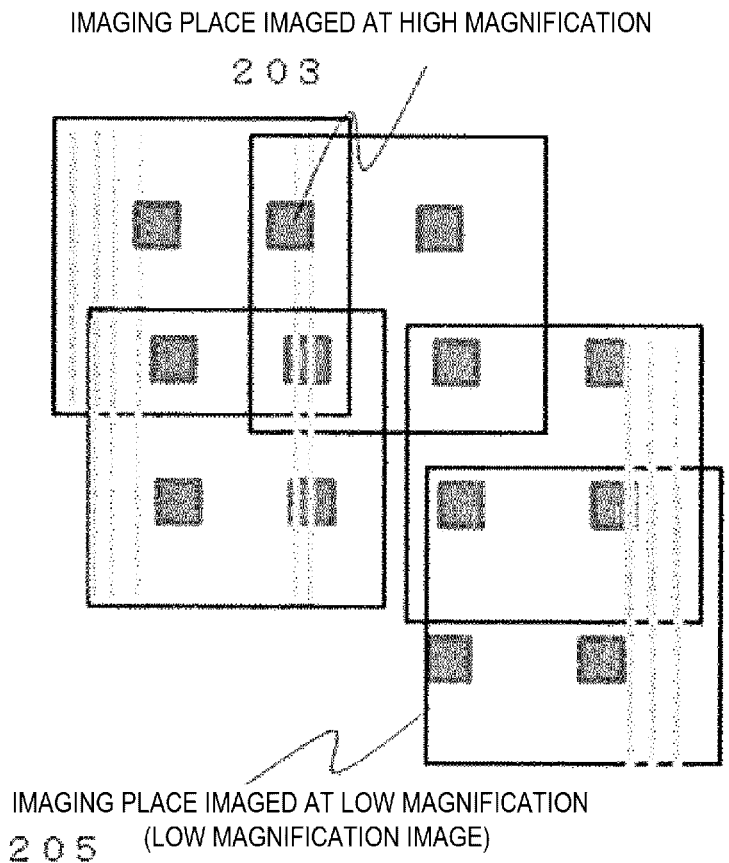

[FIG. 11]
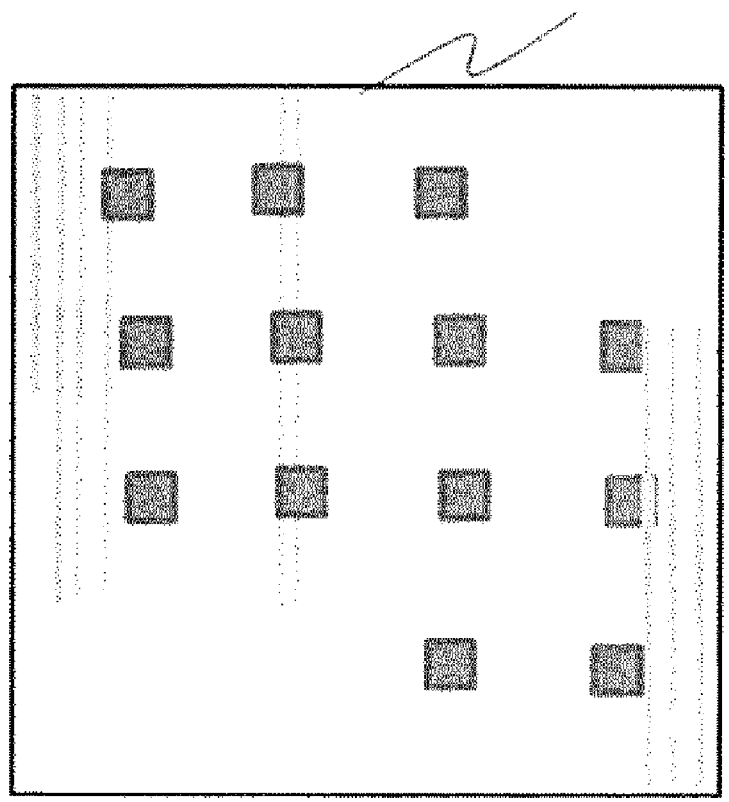
OVERLAPPED IMAGE 210
[FIG. 12]
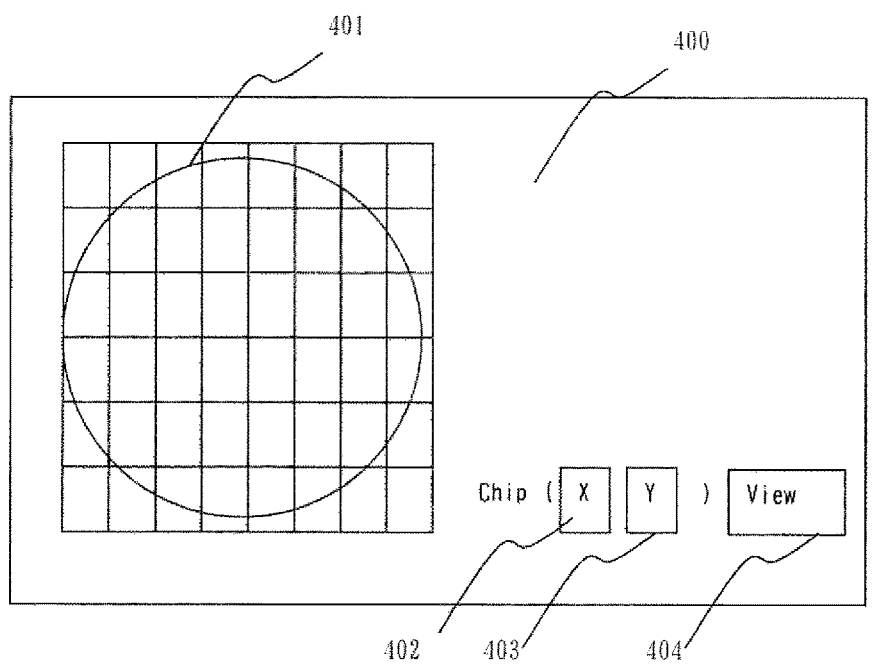

[FIG. 13]
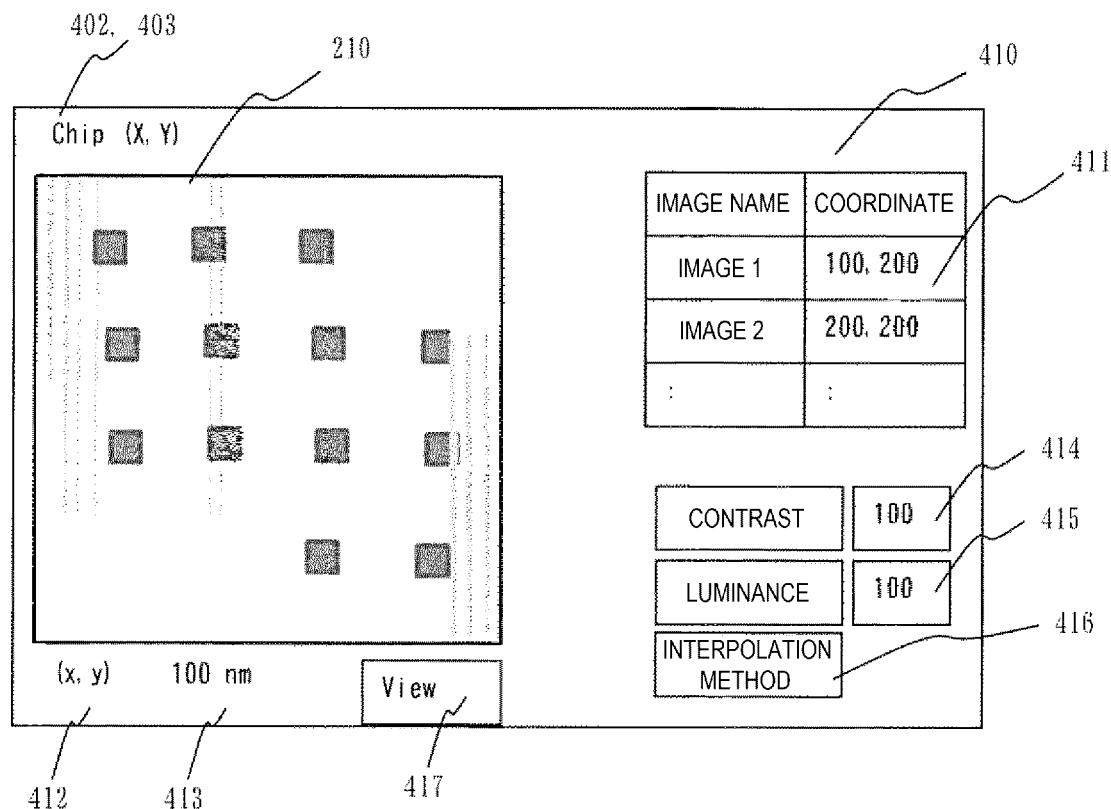
[FIG. 14]
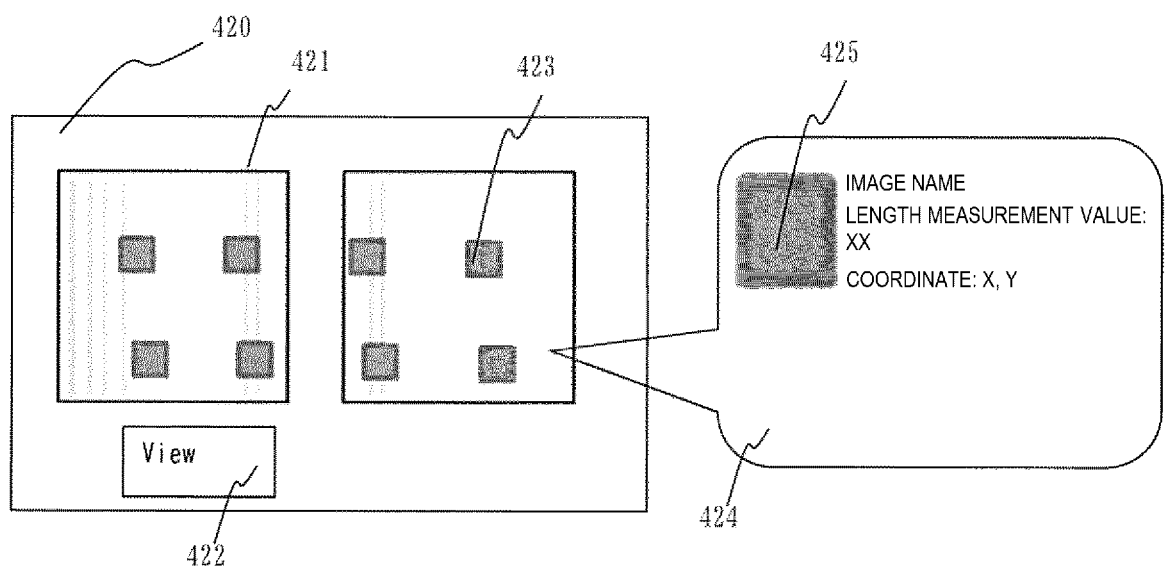

[FIG. 15]
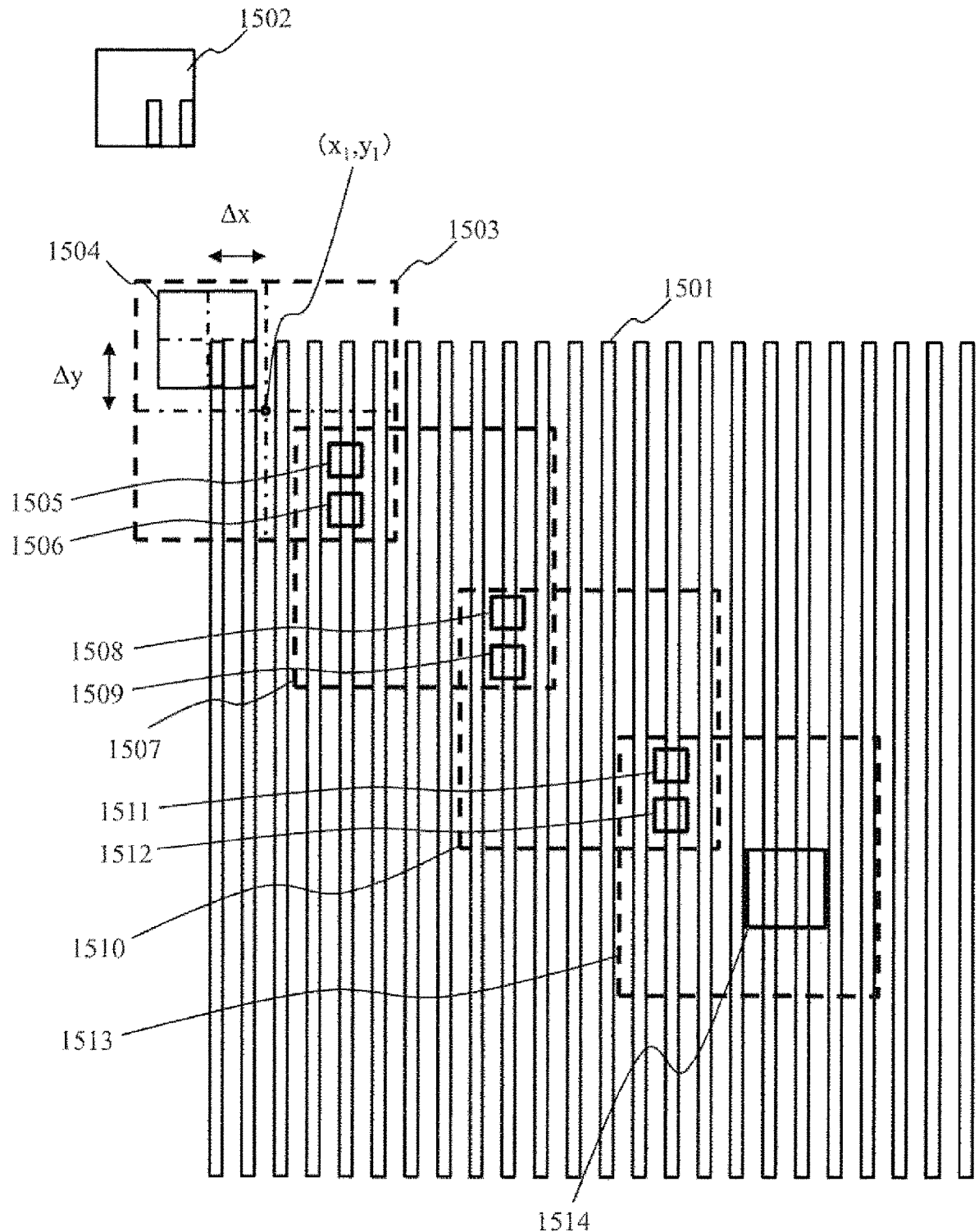

[FIG. 16]
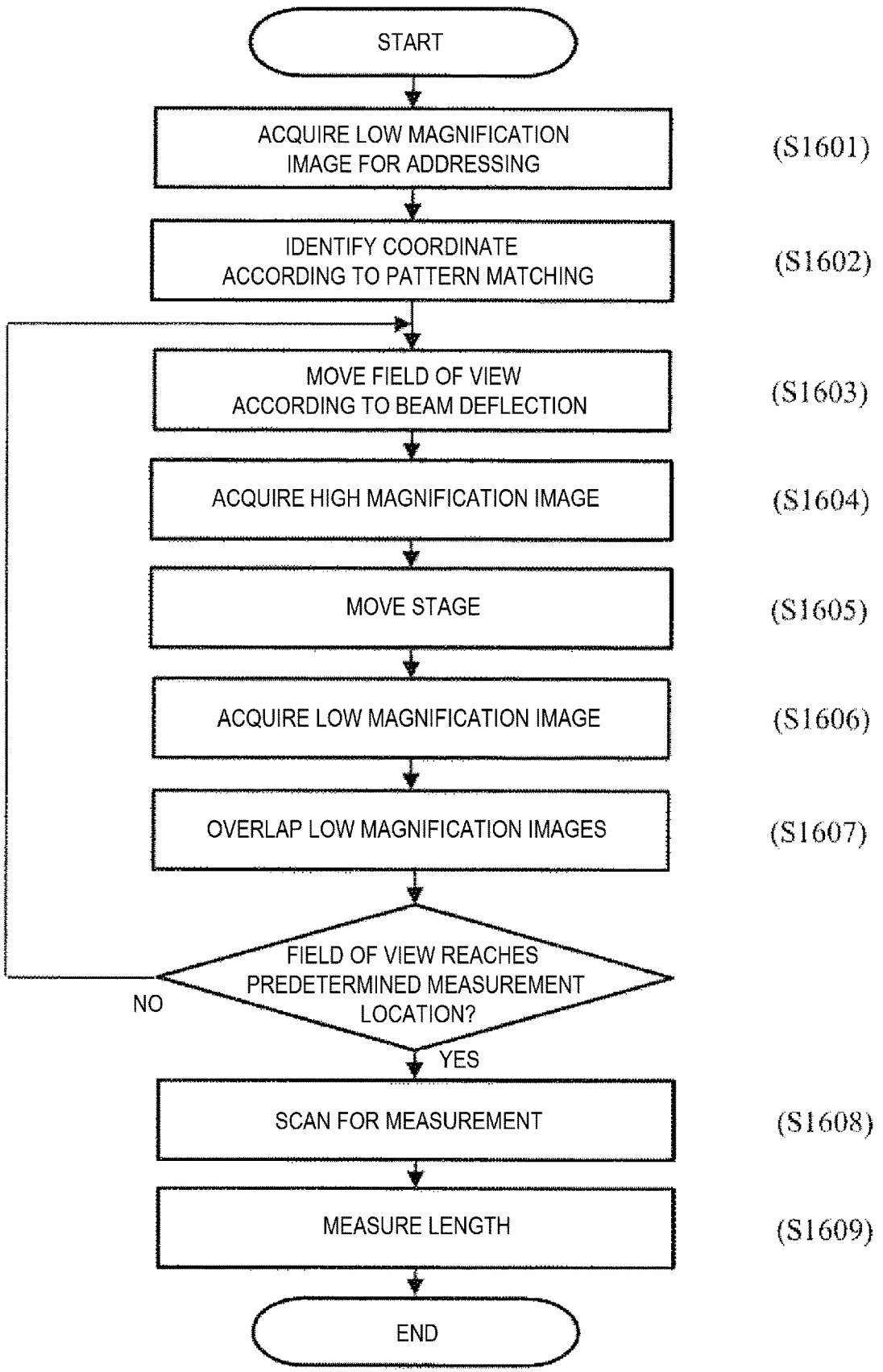

CHARGED PARTICLE BEAM DEVICE

TECHNICAL FIELD

The present invention relates to a charged particle beam device, and more particularly to a charged particle beam device capable of measuring a pattern repeatedly formed on a sample with high accuracy.

BACKGROUND ART

A charged particle beam device such as a scanning electron microscope is used to measure and inspect a semiconductor device with advanced miniaturization. On the other hand, in recent years, miniaturization advances along with higher functionality and multiple functions of an electronic device, and a circuit pattern become denser. As a new technique of forming a pattern with a smaller pitch and with a typical dimension equal to or less than 30 nm, a technology such as Self-aligned double patterning (SADP) or Self-aligned quadruple patterning (SAQP) which performs SADP twice is introduced. Since the same pattern is repeatedly arranged in the pattern generated by such a patterning method, it is necessary to accurately specify the pattern generated in a process to be evaluated in order to perform an appropriate process evaluation. Patent Literature 1 describes a method of evaluating a roughness of a pattern based on image data, and specifying a pattern position based on a roughness evaluation value. Further, Patent Literature 2 describes a method of identifying a type of a pattern and measuring the pattern of which the type is identified by irradiating a pattern region with a clear relevance to a measurement target place with inclined beam.

PRIOR ART LITERATURE

Patent Literature

PTL 1: JP-A-2015-203614
PTL 2: Japanese Patent No. 6043528 (corresponding to U.S. Pat. No. 8,872,106)

SUMMARY OF INVENTION

Technical Problem

According to the method disclosed in Patent Literature 1, in view of a difference in the roughness evaluation value for each step, although the pattern is identified by comparing the roughness evaluation values, it is considered that the identification of the pattern becomes difficult when occurrence of roughness is not stable due to some factor. Further, according to Patent Literature 2, although it is possible to identify the pattern with high accuracy based on signal waveform processing, it is considered that a profile shape changes depending on a quality of an end of the pattern and a scanning line direction, and accurate pattern identification cannot be performed.

Hereinafter, a charged particle beam device is proposed which aims at identifying repeated patterns generated by a multiple exposure method such as SADP or SAQP with high accuracy.

Solution to Problem

As an embodiment for achieving the above object, there is provided a charged particle beam device which includes a deflector which deflects a charged particle beam emitted from a charged particle source; a stage which moves a sample which is an irradiation object of the charged particle beam; and a control device which controls the deflector and the stage, wherein the control device controls the deflector to form an irradiation mark on the sample by irradiating a first position on the sample with the charged particle beam; after the formation of the irradiation mark, acquires a first image by controlling the deflector to scan the charged particle beam on a first field of view which includes the first position and is larger than the irradiation mark; controls the deflector to scan the charged particle beam on a second field of view which includes the first position, is larger than the irradiation mark and in a position different from the first field of view, thereby acquiring a second image; and synthesizes the first image and the second image so as to overlap the irradiation marks included in the first image and the second image.

Advantageous Effect

According to the above configuration, it is possible to acquire an image by performing measuring or inspecting with high accuracy over a wide range.

BRIEF DESCRIPTION OF DRAWINGS

FIG. 1 is diagram showing an overview of a scanning electron microscope.

FIG. 2 is a view showing an example of a repeated pattern.

FIG. 3 is a flowchart showing a step of generating a plurality of images including irradiation marks and superimposing the plurality of images based on the irradiation marks after the irradiation marks of a beam are attached.

FIG. 4 is a view showing an example in which a region for acquiring a high magnification image is set in a dense repeated pattern group.

FIG. 5 is a view showing an example in which the region for acquiring the high magnification image and a region for acquiring a low magnification image are set in the dense repeated pattern group.

FIG. 6 is a view showing an example of the low magnification image acquisition region set on a sample.

FIG. 7 is a view showing a positional relationship between an imaging position of the low magnification image and the dense repeated pattern.

FIG. 8 is a diagram showing an example of a measurement system including the scanning electron microscope.

FIG. 9 is an explanatory diagram of a method of superimposing the low magnification image using a high magnification imaging place (contamination).

FIG. 10 is a view showing an example in which a plurality of low magnification images are superimposed.

FIG. 11 is a view showing an example of a superimposed image when the plurality of low magnification images are superimposed.

FIG. 12 is a view showing a display example of a synthesized image.

FIG. 13 is a view showing an example of a Graphical User Interface (GUI) screen which sets an image generation condition of the synthesized image.

FIG. 14 is a view showing a display example of the high magnification image and the low magnification image as synthesized objects.

FIG. 15 is a view explaining a positional relationship between an irradiation mark formed in the repeated pattern and the low magnification image.

FIG. 16 is a flowchart for explaining a field of view position setting step when the synthesized image is generated.

DESCRIPTION OF EMBODIMENTS

Hereinafter, a charged particle beam device which measures a wide region by imaging a sample at low magnification after imaging the sample at high magnification in the charged particle beam device will be described.

A charged particle beam device represented by a Scanning Electron Microscope (SEM) is a device which detects a charged particle (secondary electron or the like) obtained by scanning the sample with a charged particle beam such as an electron beam, and forms an image. The sample is placed on a sample stage called a stage, and a desired position of the sample can be inspected by deflection of the charged particle with a stage movement. In particular, in order to measure a circuit pattern present at a desired location on a semiconductor device, in the SEM which measures and inspects a semiconductor, a program that stores an operation condition of a device called a recipe is created in advance, and measurement and inspection are executed based on the condition set in the recipe. The charged particle beam device has high magnification and high measurement reproducibility, and new applications and requirements are generated, such as a simple length measurement or a pitch measurement, as well as an index which evaluates a quality of a pattern appearing in the image.

On the other hand, the miniaturization technique by a process device such as SADP and SAQP is advancing. SADP is a new technique of forming a pattern with a smaller pitch, and a method in which after a resist pattern is formed according to related lithography, a film is formed as a whole, and etching is performed to form a pattern on a side wall of the resist pattern. Accordingly, it is possible to form a dense pattern with a pitch that is half the pitch of the pattern created in the lithography at the beginning. The SAQP forms a fine line and space pattern by a method of performing film deposition on a pattern formed by the SADP and performing etching to divide the pitch.

It is desirable to increase an imaging range in the inspection of the repeated dense pattern, but when the resolution is reduced, the pattern of the image cannot be determined. However, imaging of a multi-pixel image with an increased resolution leads to a decrease in throughput and a compression of a storage region.

In addition, in a Critical Dimension-SEM (CD-SEM) measurement sequence, alignment is performed in the vicinity of the measurement region in order to accurately capture a measurement pattern, but it is difficult to accurately reach the dense repeated pattern of a measurement object present at a distance accompanied with the stage movement from an alignment location. That is, the resolution of the image imaged at high magnification is high, but the accuracy of an imaging location decreases.

Since it is difficult to obtain an image of a wide region with a high resolution in this manner, it is difficult to accurately identify and measure the repeated dense pattern with high accuracy. That is, in order to measure the repeated dense pattern, if the image of the wide region with the high resolution can be acquired with high efficiency, a pattern generated by SADP or the like can be measured with high accuracy.

Hereinafter, the charged particle beam device capable of acquiring a high resolution image and acquiring an image of the wide region with high efficiency will be described.

When an observation is performed by a surface observation device using the charged particle beam, for example, an electron microscope, the contamination (carbon adhesion) adheres to apart of the sample irradiated with the electron beam depending on a device condition. The contamination is that a hydrocarbon-based gas molecule remaining in a vacuum chamber for an observation of a substrate or emitted from the substrate itself aggregated accumulated in a part irradiated with charged particles.

In the embodiment, a charged particle beam device is described, in which contamination adheres to a first position on the sample by acquiring a high magnification (narrow field of view) image, and the contamination is set as a reference position of a low magnification image obtained by performing scanning with a beam in a wide region (wide field of view) including an region to which the contamination adheres. More specifically, the charged particle beam device will be described, in which the irradiation mark is attached to the sample by irradiating a first irradiation region with the beam, a first image which is obtained by scanning the beam is acquired in a first region including the irradiation mark and wider than the irradiation mark, and a second image is acquired in a second region including the irradiation mark and wider than the irradiation mark, and at a position different from the first region which is obtained by scanning the beam, and the first image and the second image are superimposed on the basis of the irradiation mark.

In the present embodiment, a fact that the contamination is left in an imaging region of the sample is used. It is possible to specify a synthesis position of an image in a contamination place, and perform a wide region measurement by synthesizing a plurality of images. The irradiation mark of the beam may be formed on the sample by a sputter phenomenon based on the irradiation of the beam other than the contamination, and may be a charging attached on the sample by irradiating with the beam. When the charging is attached and the low magnification image is acquired, a difference in an amount of charged particles emitted from the sample is generated and a potential contrast is formed because of a difference in potential with respect to the other parts, so that the low magnification images at different positions are superimposed by using the potential contrast. A dose amount may be larger than a normal observation beam to ensure the adhesion of contamination.

FIG. 9 is a view showing an outline of superimposition processing of images using irradiation marks.

First, imaging is performed at high magnification with a high measurement accuracy (imaging of an imaging location 204). As a result, the contamination is generated in an imaging place. In the imaging, first, from the alignment location in the vicinity of the measurement region, a place not accompanied by the stage movement is imaged. Next, another imaging place imaged at high magnification 203 included in a low magnification image acquisition region to be described later is imaged. Here, a predetermined position included in the same low magnification imaging range is imaged. Thereafter, imaging of a position included in the same low magnification imaging range is repeated.

Then, a wide region including a plurality of regions imaged at the high magnification is photographed at low magnification. First, a low magnification image 1 (206) is acquired by imaging an region including the high magnification imaging place at the alignment location and another high magnification imaging place (imaging location 204) at low magnification. Thereafter, a low magnification image 2 (207) is acquired by imaging a range including the high magnification imaging place (for example, the imaging place 203) which is included in the low magnification image region imaged earlier.

The high magnification imaging place is present as a contamination trace in the low magnification image obtained by the imaging result. There exist a plurality of low magnification images including the same contamination since the low magnification image is imaged by overlapping the high magnification imaging place. Since it is the same contamination of the sample, it is possible to perform processing on a wide region image by repeating synthesizing images at this position. The high magnification imaging place at the first alignment location has a high coordinate accuracy, and the wide region image including this place can be measured even in a repeated dense pattern. In addition, if there is CAD data, the synthesis position of the image can be estimated from pattern shapes on the image at the same time.

In this manner, accurate coordinates of the measurement region imaged at high magnification can be estimated from the contamination position of the low magnification image, and a plurality of low magnification images can be synthesized based on the position of the contamination. The synthesized image is an image covering a wide region, and it can be captured in a single image from an alignment location to a region which is difficult to be measured in the related art.

As a result, an image of a wide region having a resolution capable of pattern analysis can be obtained, and the repeated dense pattern of the region which is difficult to measure in the related art can be measured.

According to the above configuration, it is possible to create an image covering a wide region by imaging at the low magnification after imaging at the high magnification, and it is possible to measure the repeated dense pattern, which is difficult in the related art.

Hereinafter, specific embodiments will be described in detail with reference to the drawings. FIG. 1 is a diagram showing an outline of the charged particle beam device. As shown in FIG. 1, a charged particle beam device (100) is configured to include a charged particle optical system device (10) and a control computer (20).

The charged particle optical system device (10) includes a charged particle source (1), condenser lenses (3), deflecting lenses (4), objective lenses (5), a secondary electron detector (6), and the like. The charged particle beam (2) emitted from the charged particle source (1) is focused by the condenser lenses (3), scanned and deflected by the deflecting lenses (4), and focused by the objective lenses (5), a sample (8) held on a sample stage (7) is irradiated, and a secondary electron (9) emitted from the irradiation place of the charged particle beam (2) of the sample (8) is detected by the secondary electron detector (6).

Further, the detection signal of the secondary electron (9) detected by the secondary electron detector (6) is transmitted to an image processing device (22) via an amplifier (not shown), an Analog to Digital (A/D) converter, or the like. The image processing device (22) generates an image based on the secondary electron (9) on the surface of the sample (8) as an observation image based on the detection signal from the secondary electron detector (6) and a scanning control signal of the deflecting lenses (4), the generated observation image is displayed on a display device (23).

The control computer (20) includes a storage device which stores information including design data (21) for pattern design of the sample (8), and the control computer (20) is connected to an image processing device (22), a display device (23), an input device (24) such as a keyboard and a mouse, and further connected to the charged particle optical system device (10) via a control device (not shown).

In this case, the control computer (20) acquires various information (observation region, magnification, brightness, and the like) for acquiring an observation image input by the user via the input device (24), and operations of the charged particle source (1), the condenser lenses (3), the deflecting lenses (4), the objective lenses (5), and the sample stage (7) in the charged particle optical system device (10) are controlled via the control device (not shown) based on the information. Further, the control computer (20) also adds further processing to the observation image generated by the image processing device (22), to generate an image for a more advanced observation, length measurement, and inspection, and the result is displayed on the display device (23). The charged particle beam device illustrated in FIG. 1 includes a field-of-view moving deflector (not shown). The field-of-view moving deflector is also referred to as an image shift deflector, which is possible to move the field of view without the stage movement by moving the field of view of the electron microscope (scanning region).

FIG. 2 is a view showing an example of a dense repeated pattern (201). Although a similar pattern is continuous within a unit area and the alignment is performed in the vicinity of the measurement region, the accurate position measurement of the dense repeated pattern present at the distance accompanied with the stage movement from the alignment location becomes difficult due to stage movement accuracy. The region is a region (202) which is difficult to measure.

FIG. 3 is a flowchart showing a measurement coordinate identification processing step involving contamination adhesion. First, the sample is imaged at high magnification (301). As a result, a high magnification image is created, and contamination adheres to the sample. The high magnification imaging place selects a location without stage movement (that is, a deflection range by the image shift deflector) from the alignment location (for example, addressing pattern position).

Next, a wide region including the high magnification imaging place at 201 of the sample is imaged at low magnification (302). As a result, the low magnification image is created. The low magnification image includes a high magnification imaging place, and is a luminance region different from the other portions due to the adhesion of contamination. At the time of obtaining the low magnification image, the imaging location is selected such that the same high magnification imaging place as that of another low magnification image is included. Next, the obtained low magnification image is aligned at the high magnification imaging position (303). At this time, a plurality of low magnification images can be superimposed at a common high magnification imaging place by using a fact that the same high magnification imaging place is included in the plurality of low magnification images. By repeating the superposition, a wider range can be handled as a single image, and a positional relationship between an alignment location and a pattern included in the region which is difficult to measure becomes clear. As a result, it is possible to specify coordinates of the region that is difficult to measure (304).

The state of the image imaging is illustrated in FIGS. 4 to 7. As illustrated in FIG. 4, the contamination adheres to the imaging place imaged at high magnification (203) on the sample, and an adhesion place can be confirmed in a subsequent imaged image. The alignment is performed in the vicinity of the measurement region of the repeated pattern (201), and an imaging location without stage movement (204) from the alignment location is imaged. Further, coordinates on the sample as the low magnification imaging range are imaged at the high magnification. As a result, the contamination as shown in FIG. 4 adheres to the sample.

Next, as illustrated in FIG. 5, imaging at low magnification is performed. At the time of low magnification imaging, imaging is performed such that the imaging location without stage movement (204) from the alignment location, and another imaging place imaged at high magnification (203) are included in the field of view. Imaging is performed on the next imaging position including the same imaging place imaged at high magnification (203) as the previous low magnification image or another imaging place imaged at high magnification (203). In this way, a low magnification imaging place (205) is determined, and the imaging is sequentially performed. As a result, imaging as shown in FIG. 6 is performed, and a low magnification image (205) as shown in FIG. 7 is stored. The dense repeated pattern (201) is also present in the low magnification image (205), but at this time, the accurate position cannot be specified.

FIG. 8 is a diagram showing an example of a measurement system including a scanning electron microscope 801. In the example of FIG. 8, an example is shown in which the scanning electron microscope 801 as an imaging system and an arithmetic processing unit 805 (pattern measurement device 802) which executes measurement processing are connected via a network based on a detection signal, however, not limited to this, the image processing device included in the control device of the scanning electron microscope may also perform the arithmetic processing as described in the embodiment. The system illustrated in FIG. includes a scanning electron microscope 801, a pattern measurement device 802 which executes pattern measurement and the like based on the obtained signal, a design data storage medium 803 in which a design data or a layout data generated based on the design data of the semiconductor device is stored, and an input device 804 including a display unit.

Here, the pattern measurement device 802 is connected to the scanning electron microscope 801 via a LAN, and the pattern measurement device 802 acquires the detection signal and a measurement result from the scanning electron microscope 801. The detection signal and the measurement result include a length measurement file, an image, a file of the imaging condition, and the like. As illustrated in FIG. 7, the imaging result of the low magnification imaging place (205) including the imaged imaging place (203) is included in the detection signal and the measurement result, and the low magnification image exists therein. An image synthesis processing unit 807 synthesizes images included in the detection signal and the measurement result, and a result image is displayed on the display device such as the input device 804.

The image synthesis processing unit 807 organizes the low magnification image (205) included in the detection signal or the like for each imaging position. First, as illustrated in FIG. 9, the low magnification image 1 (206) including the imaging location without stage movement (204) from the alignment location is identified. The low magnification image 2 (207) including another imaging place imaged at high magnification (203) included in the image is specified. The point can be superimposed since the low magnification image 1 (206) and the low magnification image 2 (207) are the same as the imaging place imaged at high magnification (203).

As illustrated in FIG. 10, by overlapping a plurality of low magnification images such that the positions of the imaging places imaged at high magnification (203) included in both of the plurality of low magnification images are matched, a plurality of low magnification images can be overlapped as illustrated in FIG. 11. As a result, accurate coordinates can be obtained even in the region which is difficult to measure (202).

As illustrated in FIG. 12, the input device 804 includes a screen (400) which visualizes an image synthesized by an overlapped image (210). A chip arrangement of the sample is illustrated and displayed (401) on the screen (400). When the illustrated chip coordinate is selected, an X value and a Y value of the chip coordinate are reflected in 402, 403. Alternatively, it is also possible to directly input a desired chip coordinate X to 402, and a chip coordinate Y to 403.

Here, when a View button (404) is pressed, as illustrated in FIG. 13, a screen (410) which displays the overlapped image (210) in which the chip coordinate X coincides with 402 and the chip coordinate Y coincides with 403 is displayed. When there are a plurality of images of the same chip, there may be a function capable of selecting the overlapped image (210) of a display object.

The chip coordinates (402), (403) specified by the screen (400) and the overlapped image (210) are displayed on the screen (410). Although not specifically described, the overlapped image (210) includes an enlargement/reduction display function.

In a target low magnification image list (411), the low magnification image 1 (206) and the low magnification image 2 (207) constituting the overlapped image (210) are displayed in a list.

The aligned coordinates in the overlapped image (210) may be displayed together with a low magnification image name. The image region is overlaid and displayed on the image (210) where an image row of the target low magnification image list (411) is selected and superimposed. The selection may be made in a plurality of rows.

By pressing the View button (417), as illustrated in FIG. 14, the low magnification image and the high magnification image corresponding to a selected row of the low magnification image list (411) can be displayed on another screen (420).

In a case where a point is specified on the overlapped image (210), the target image list in the target low magnification image list (411) is highlighted. Further, a coordinate at the point is displayed at the coordinate (412).

Length measurement value and length measurement point information in the vicinity of the point specified together are displayed in the length measurement point information display region (413). The information to be displayed in the length measurement point information display region (413) can also display imaging information imaged at high magnification.

An image can be observed, in which the contrast of the overlapped image (210) and the luminance of the overlapped image (210) are changed by raising and lowering a contrast value (414) and a luminance value (415). In addition, the interpolation method in the display of the overlapped image (210) can be selected from the interpolation method (416).

A low magnification image and a high magnification image as a synthesized object can be observed on the screen (420). A low magnification image (421) corresponding to the selected row of the low magnification image list (411) is displayed on the screen (420). The image name and the imaging position information of the low magnification image (421) are displayed on the screen (420) although not particularly described.

The high magnification image (425) corresponding to a high magnification imaging place (423) in the vicinity of the point can be displayed on a screen (424) by designating a point on the low magnification image (421) or pressing a View button (422). It is possible to display an image name, a length measurement value, and a length measurement coordinate as information of the high magnification image (425) and confirm the imaging contents on the screen (424). It is also possible to refer to highly accurate measurement results at high magnification on the synthesized image.

Then, a more specific example will be described using FIGS. 15 and 16. FIG. 15 is a view showing a field of view position setting step of the electron microscope with respect to a pattern 1501 generated by multiple exposure. FIG. 16 is a flowchart for explaining the field of view position setting step. First, after the sample is introduced into the electron microscope, the low magnification image for addressing is acquired. The addressing is performed in order to specify the accurate position on the sample by template matching using a template image 1502, and the field of view is moved to a measurement target pattern based on the field of view position specification. In the example of FIG. 15, an image of a corner portion of a pattern group generated by a multiple exposure method is registered as a pattern image used for template matching. The template image 1502 is registered in a memory 806 in advance, and a matching processing unit 808 identifies the position (coordinate) of an addressing pattern 1504 by performing a search using the template image 1502 on the low magnification image (searched image, first low magnification image 1503) obtained by the electron beam scanning after the stage movement for moving the field of view to the addressing pattern (step 1602).

Here, it can be seen that the position of the addressing pattern 1504 is deviated by (Δx,Δy) with respect to the targeted stage coordinate, and a current field of view position (x1,y1) can be specified. In this state, a beam deflection for a predetermined amount of field of view movement is performed without performing stage movement, and the high magnification images are acquired for regions 1505, 1506. The regions 1505, 1506 and the addressing pattern 1504 are included in a deflectable range according to the image shift deflector. Next, the stage movement is performed so as to move the field of view toward a measurement target pattern region 1514 (step 1605). After the stage is moved, the low magnification image (second low magnification image 1507) is acquired based on beam scanning (step 1606).

It is desirable that the overlap between the field of view of the second low magnification image 1507 and that of the first low magnification image 1503 be set somewhat big to a certain extent in consideration of a stage movement error. Since the regions 1505, 1506 to which contamination adheres are displayed in the second low magnification image 1507, the second low magnification image 1507 is moved relatively to the first low magnification image 1503, and pattern matching using the contamination image is executed. At this time, since there is a common contamination pattern (1505, 1506) in a region where both are overlapped, the position at which both are overlapped is specified by matching degree determination.

The image synthesis processing unit 807 performs the superimposition of the two low magnification images after the alignment (step 1607). The superposition makes it possible to specify the field of view position of the second low magnification image 1507. This is because the relative position with the already identified first low magnification image 1503 is known. Further, a pattern count processing unit 809 counts the number of patterns from a furthest end of the pattern group. For the pattern generated by the multiple exposure method, patterns (spacer, gap) are arranged in a predetermined rule, for example, if the order of the spacers can be specified, the type of the patterns included in the field of view can be specified. The information of the type of the pattern corresponding to the type of the exposure method is stored in advance in the memory 806, and the type of the pattern can be identified by counting the pattern from the end of the pattern formation region. As in the embodiment, by continuously acquiring images without being spaced from the end of the pattern group, it is possible to accurately specify the type of the pattern even in the pattern of the field of view separated from the end of the pattern group.

Then, it is determined whether or not the measurement target pattern region 1514 is included in the deflection range by the field-of-view moving deflector, and if not included, the field of view is moved again according to the beam deflection to acquire a high magnification image (in the example of FIG. 15, the regions 1508, 1509 are scanned with the beam to obtain high magnification images). Then, the stage movement for moving the field of view toward the measurement target pattern 1514, the acquisition of a third low magnification image 1510, and the superimposition of the second low magnification image 1507 and the third low magnification image 1510 using the contamination pattern adhering to the regions 1508, 1509 are executed. As described above, steps 1603 to 1607 are repeated until the arithmetic processing unit 805 reaches a region including the measurement target pattern region 1514 in the deflection range by the field-of-view moving deflector.

In a deflection range according to the field-of-view moving deflector, when it is determined that the measurement target pattern region 1514 is included (the measurement target pattern 1514 is included in the low magnification image 1513), the beam is deflected in the measurement target pattern region 1514, the region is scanned (step 1608), so that the length measurement of the pattern is executed (step 1609). Positioning of the field of view in the measurement target pattern region 1514 is performed based on pattern recognition in the low magnification image 1513 which is a fourth low magnification image. Specifically, when it is an SADP pattern, and in the case of the exposure method in which the core gap is formed at the furthest end, the SADP pattern is regularly arranged in a way of a core gap, a spacer, a spacer gap, a spacer, a core gap, a spacer, a spacer gap . . . . Thus, the position of the desired measurement target pattern is specified using the low magnification image superimposed by the overlapped region, and a field of view is accurately positioned in the measurement target pattern. For example, when the measurement target pattern is designated as the "third core gap from the end of the SADP pattern", in the case of the SADP pattern of the above arrangement, the 10th pattern corresponds to the pattern. Therefore, the pattern included in the superimposed low magnification image is counted from the end by using the pattern count processing unit 809, and the field of view position of the high magnification image is accurately specified by specifying the position of the desired measurement target pattern on the low magnification image.

In the embodiment, the stage movement is repeated until the desired measurement target pattern is included in the deflection range of the field movement deflector, a low magnification image is acquired without interruption from the end of the pattern group to the measurement target pattern, and by superimposing the low magnification images, accurate pattern identification can be performed even at a position separated from the end of the pattern group. Instead of counting the patterns, the distance to the desired pattern on the low magnification image may be obtained by obtaining the pitch of the specific pattern using the electron microscope image, and the position of the measurement target pattern may be specified using the distance information.

When visual field movement is performed accompanied by stage movement, in a case where there is a difference between the stage coordinate after movement and the field of view position after movement specified using the low magnification image, the stage movement may be performed so as to compensate for the difference in the next stage movement.

In FIG. 15, an example in which two contamination patterns adhere to an overlapped region of the low magnification image is described, but the contamination pattern may also be one. Further, instead of performing the scanning for acquiring the high magnification image, a spot-shaped irradiation may be performed in which the irradiation mark with a size sufficient to be recognized in the low magnification image is left. However, by making a plurality of contamination patterns adhere to the sample, it is possible to capture the arrangement of the contamination patterns as a pattern, and it is possible to expect improvement in the synthesis accuracy between the low magnification images. Further, by generating a plurality of high magnification images in each low magnification image, it is possible to acquire measurement values of a plurality of patterns from the end of the pattern group to the measurement target pattern. A positional dependency of the measurement value may be obtained by obtaining a statistical value (for example, an addition average) of the measurement value, and evaluating the relationship between a measurement position and the measurement value.

According to the embodiment described above, even in the measurement result of the position separated from the end of the pattern group, it is possible to accurately specify the position based on the end of the pattern group, and as a result, it is possible to measure an appropriate measurement object. Further, it is also possible to verify whether or not the measurement is properly performed by generating the synthesized image.

REFERENCE SIGN LIST 1 charged particle source
2 charged particle beam
3 condenser lens
4 deflecting lens
5 objective lens
6 secondary electron detector
7 sample stage
8 sample
9 secondary electron
10 charged particle optical system device
20 control computer
21 design data (CAD data)
22 image processing device
23 display device
24 input device (keyboard, mouse, and the like)
201 dense repeated pattern
202 region which is difficult to measure
203 imaging place imaged at high magnification
204 imaging location which does not move
205 low magnification imaging place imaged
206 low magnification image 1
207 low magnification image 2 including another imaging place imaged at high magnification (203)
210 result of overlapping a plurality of low magnification images
400 screen which visualizes a synthesized image
401 chip arrangement of the sample is illustrated and displayed
402 chip coordinate X
403 chip coordinates X
404 View button of screen (400)
410 screen which displays overlapped image (210)
411 target low magnification image list
412 selection coordinate
413 length measurement point information display region
414 contrast value
415 luminance value
416 interpolation method
417 View button of screen (410)
420 display screen of low magnification image
421 low magnification image
422 View button of screen (420)
423 high magnification imaging place in the vicinity
424 display screen of high magnification image
425 high magnification image

The invention claimed is:

1. A charged particle beam device comprising:
a deflector which deflects a charged particle beam emitted from a charged particle source; a stage which moves a sample which is an irradiation object of the charged particle beam; and a control device which controls the deflector and the stage, wherein
the control device controls the deflector to form an irradiation mark on the sample by irradiating a first position on the sample with the charged particle beam; after the formation of the irradiation mark, acquires a first image by controlling the deflector to scan the charged particle beam on a first field of view which includes the first position and is larger than the irradiation mark; acquires a second image by controlling the deflector to scan the charged particle beam on a second field of view which includes the first position, is larger than the irradiation mark and in a position different from the first field of view; and synthesizes the first image and the second image so as to overlap the irradiation marks included in the first image and the second image.

2. The charged particle beam device according to claim 1, wherein
the control device irradiates with the charged particle beam such that a plurality of irradiation marks are included in the second image, aligns a position with the first image by using a part of the plurality of irradiation marks, and aligns a position with a third image which is superimposed with the second image in part of a field of view by using another part of the plurality of irradiation marks, and synthesizes the second image and the third image.

3. The charged particle beam device according to claim 1, wherein
the control device controls the stage and moves the sample after acquiring the first image and before acquiring the second image.

4. The charged particle beam device according to claim 1, wherein
the control device specifies a type of a pattern included in a synthesized image based on a distance from an end of a pattern group included in the synthesized image generated by combining the plurality of images or a number of patterns.

5. An image generation method of generating an image of a pattern generated by a multiple exposure method, the image generation method comprising:
forming an irradiation mark on the sample by irradiating a part of a pattern group generated by the multiple exposure method with a charged particle beam; acquiring a first image by scanning a first field of view which includes the irradiation mark and is larger than the irradiation mark with the charged particle beam; acquiring a second image by scanning a second field of view which includes the irradiation mark, is larger than the irradiation mark and in a position different from the first field of view with the charged particle beam; and synthesizing the first image and the second image so as to overlap the irradiation marks included in the first image and the second image.

6. An image processing device comprising: an arithmetic processing unit which generates an image based on a detection signal obtained by a charged particle beam device, and a display device which displays an image based on an output of the arithmetic processing unit, wherein
the arithmetic processing unit synthesizes a first image including an irradiation mark of a charged particle beam and a second image with the same irradiation mark as the first image and at a field of view position different from the first image so as to overlap the irradiation marks, and the display device displays a synthesized synthesize image.

* * * * *